US009686455B2

(12) United States Patent
Utsumi et al.

(10) Patent No.: US 9,686,455 B2
(45) Date of Patent: Jun. 20, 2017

(54) COMPONENT-RECOGNIZING APPARATUS, SURFACE-MOUNTING APPARATUS, AND COMPONENT-INSPECTING APPARATUS

(71) Applicant: YAMAHA HATSUDOKI KABUSHIKI KAISHA, Shizuoka (JP)

(72) Inventors: Tomoyoshi Utsumi, Shizuoka (JP); Hiroshi Kobayashi, Shizuoka (JP); Naoki Hanamura, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 0 days.

(21) Appl. No.: 14/679,851

(22) Filed: Apr. 6, 2015

(65) Prior Publication Data
US 2015/0215503 A1     Jul. 30, 2015

Related U.S. Application Data

(62) Division of application No. 12/521,094, filed as application No. PCT/JP2007/074897 on Dec. 26, 2007, now abandoned.

(30) Foreign Application Priority Data

Dec. 28, 2006 (JP) ................................ 2006-355295
Dec. 28, 2006 (JP) ................................ 2006-355296
Dec. 28, 2006 (JP) ................................ 2006-355297

(51) Int. Cl.
*H04N 7/18* (2006.01)
*H04N 5/225* (2006.01)
(Continued)

(52) U.S. Cl.
CPC ......... *H04N 5/2252* (2013.01); *G06T 7/0004* (2013.01); *H04N 7/18* (2013.01); *H05K 13/0413* (2013.01)

(58) Field of Classification Search
CPC ........................... H04N 5/2252; G06T 7/0004
(Continued)

(56) References Cited

U.S. PATENT DOCUMENTS 6,546,126 B1    4/2003    Wittmann et al.
6,577,410 B1    6/2003    Tsai
(Continued)

FOREIGN PATENT DOCUMENTS

EP      0449481 A1    3/1991
EP      0449481 A1    10/1991
(Continued)

OTHER PUBLICATIONS

International Search Report; PCT/JP2007/074897; Jan. 29, 2008.
(Continued)

*Primary Examiner* — Nguyen Truong
(74) *Attorney, Agent, or Firm* — Studebaker & Brackett PC

(57) ABSTRACT

In an apparatus adapted to scan a lower side of an electronic component being suction-held by a suction-holding nozzle, to perform image recognition of suction-held conditions of the electronic component, this invention is intended to perform a transfer operation under a condition that the suction-holding nozzle is arranged closer to an upper surface of a base, wherein the optical path directed downwardly from the suction-holding nozzle is bended in a lateral direction by a first optical path changing member and then further bended in another direction by a second optical path changing member to allow image-sensing means to capture an image of a lower surface of the suction-holding nozzle, and the electronic component being suction-held by the suction-holding nozzle is illuminated along the lateral optical path changed by the first optical path changing member.

9 Claims, 10 Drawing Sheets

(51) Int. Cl.
*H05K 13/04* (2006.01)
*G06T 7/00* (2017.01)

(58) Field of Classification Search
USPC .......................................................... 348/86
See application file for complete search history.

(56) References Cited

U.S. PATENT DOCUMENTS

| | | | |
|---|---|---|---|
| 6,904,672 | B2 | 6/2005 | Nagafuku et al. |
| 7,050,623 | B1 * | 5/2006 | Fukuda ................. H05K 13/08 29/740 |
| 7,185,424 | B2 | 3/2007 | Mitsumoto et al. |
| 7,458,147 | B2 * | 12/2008 | Kawase ............. H05K 13/0408 29/832 |
| 7,490,399 | B2 | 2/2009 | Mitsumoto et al. |
| 7,539,339 | B2 | 5/2009 | Tanabe et al. |
| 7,540,080 | B2 | 6/2009 | Fukunaga |
| 7,617,597 | B2 | 11/2009 | Okuda et al. |
| 2003/0133603 | A1 * | 7/2003 | Mitsumoto ........ H05K 13/0413 382/141 |
| 2008/0231824 | A1 | 9/2008 | Nagasaka |

FOREIGN PATENT DOCUMENTS

| | | |
|---|---|---|
| JP | H04-025322 A | 1/1992 |
| JP | H05-335793 A | 12/1993 |
| JP | H06-125194 A | 5/1994 |
| JP | H08-032299 A | 2/1996 |
| JP | H09-186492 A | 7/1997 |
| JP | H11-289198 A | 10/1999 |
| JP | 2003-163497 A | 6/2003 |
| JP | 2004-342653 A | 12/2004 |
| JP | 2005-109287 A | 4/2005 |
| JP | 2005-277132 A | 10/2005 |
| JP | 2005-286171 A | 10/2005 |
| JP | 2006-243617 A | 9/2006 |

OTHER PUBLICATIONS

Extended European Search Report; EP07860126.7; Dec. 23, 2009.
Japanese Office Action; JP2006-355295; Aug. 9, 2011.
Japanese Office Action; JP2006-355296; Aug. 9, 2011.
Japanese Office Action; JP2006-355297; Aug. 9, 2011.

* cited by examiner

COMPONENT-RECOGNIZING APPARATUS, SURFACE-MOUNTING APPARATUS, AND COMPONENT-INSPECTING APPARATUS

TECHNICAL FIELD

The present invention relates to a component-recognizing apparatus for image recognition of a state of an electronic component being suction-held by a suction-holding nozzle, to a surface-mounting apparatus, and to a component-inspecting apparatus having the component-recognizing apparatus.

BACKGROUND ART

Generally, a surface-mounting apparatus or a component-inspecting apparatus for electronic components comprises a head unit which is movable apart from a base by a given distance, and a suction-holding nozzle installed in the head unit, wherein the surface-mounting apparatus or the component-inspecting apparatus is adapted to transfer an electronic component to a target position while suction-holding the electronic component by the suction-holding nozzle. The head unit is provided with a component-recognizing apparatus for performing image recognition of suction-held conditions being suction-held by the suction-holding nozzle.

For example, the following Patent Document 1 discloses an art designed for a component-recognizing apparatus in a surface-mounting apparatus to allow lower-surface image-sensing means to capture an image of a lower surface of an electronic component being suction-held by a suction-holding nozzle, wherein the component-recognizing apparatus comprises: a first optical path changing member operable to change a direction of light directed downwardly from a suction-holding nozzle to a direction directed laterally from beneath the suction-holding nozzle; a second optical path changing member operable to change further the light direction directed laterally; and illumination means provided beneath the first optical path changing member.

This component-recognizing apparatus is a mechanism advantageous in reducing a mounting time, because of its ability to perform component recognition in concurrence with an X-Y movement from a component pickup position to a mounting position.

Patent Document 1: JP 8-32299A

DISCLOSURE OF THE INVENTION

The component-recognizing apparatus disclosed in the Patent Document 1 is a mechanism advantageous in reducing a mounting time, because of its ability to perform component recognition in concurrence with an X-Y movement from a component pickup position to a mounting position. Nonetheless, it is necessary to reduce a vertical height dimension of a scanning unit of the component-recognizing apparatus as much as possible, in order to allow a transfer operation to be performed under a condition the suction-holding nozzle is arranged closer to an upper surface of a base.

For example, with a view to solving this problem, if it is attempted to reduce a size of an optical system and a lens to reduce a thickness of a portion of the optical system and the illumination means located beneath the suction-holding nozzle, there arises a problem of performance degradation, such as narrowing in field of view of the lower-surface image-sensing means, and reduction in lens brightness.

It is therefore an object of the present invention to reduce a thickness of a place for a scanning camera beneath a suction-holding nozzle so as to lower a height of a head unit and downsize intended equipment in its entirety, without performance degradation, such as narrowing in field of view of lower-surface image-sensing means and reduction in lens brightness due to downsizing of an optical system and a lens.

In order to achieve this object, the present invention provides a component-recognizing apparatus comprising a movable head unit having a suction-holding nozzle capable of suction-holding an electronic component and a scanning unit which is installed to the head unit in relatively displaceable with respect to the suction-holding nozzle, the scanning unit being operable to capture an image for image recognition of suction-held conditions of the electronic component being suction-held by the suction-holding nozzle, said scanning unit including: a first optical path changing member which is adapted to be located beneath the suction-holding nozzle and is operable to bend the optical path directed downwardly from the suction-holding nozzle in a lateral direction during the image-sensing operation; a second optical path changing member operable to further bend the bended optical path in another direction; lower-surface image-sensing means disposed in the optical path changed by the second optical path changing member, the lower-surface image-sensing means is operable to capture an image of a lower surface of the electronic component being suction-held by the suction-holding nozzle through the first and second optical path changing members; and illumination means operable to emit illumination light onto the lower surface of the electronic component being suction-held by the suction-holding nozzle, along at least a lateral optical path changed by the first optical path changing member.

According to the component-recognizing apparatus of the present invention, the illumination means is operable to emit illumination light onto the lower surface of the electronic component being suction-held by the suction-holding nozzle, along at least the lateral optical path changed by the first optical path changing member. This makes it possible to eliminate a need for providing the illumination means beneath the suction-holding nozzle. Therefore, a thickness of the scanning unit can be reduced without performance degradation, such as narrowing in field of view of the lower-surface image-sensing means and reduction in lens brightness due to downsizing of an optical system and a lens. In addition, an opposed distance between the head unit and a base can be reduced to downsize intended equipment in its entirety and facilitate a reduction in installation space of the equipment.

In accordance with another aspect of the present invention, there is provided a component-recognizing apparatus comprising a movable head unit having a suction-holding nozzle capable of suction-holding an electronic component and a scanning unit which is installed to the head unit in relatively displaceable with respect to the suction-holding nozzle, the scanning unit being operable to capture an image for image recognition of suction-held conditions of the electronic component being suction-held by the suction-holding nozzle, said scanning unit including: a first optical path changing member which is adapted to be located beneath the suction-holding nozzle and is operable to bend the optical path directed downwardly from the suction-holding nozzle in a lateral direction during the image-sensing operation; a second optical path changing member operable to further bend the bended optical path in another direction so that the bended optical path directs upwardly at a given elevation angle relative to a horizontal plane; and image-sensing means disposed in the optical path changed by the second optical path changing member, the image-sensing means is operable to capture an image of a lower surface of the electronic component being suction-held by the suction-holding nozzle through the first and second optical path changing members.

In this aspect, the image-sensing means is disposed in the optical path which is changed by the second optical path changing member in such a manner as to be directed upwardly at a given elevation angle relative to a horizontal plane. This makes it possible to avoid a situation where the image-sensing means is provided to extend below the second optical path changing member.

In accordance with yet another aspect of the present invention, there is provided a component-recognizing apparatus comprising a row of suction-holding nozzles each capable of suction-holding an electronic component and a scanning unit which is installed to the head unit, the scanning unit is adapted to be relatively displaced with respect to the suction-holding nozzles to perform sequential scanning so as to capture an image for image recognition of suction-held conditions of the electronic component being suction-held by each of the suction-holding nozzles, the scanning unit including: a lower-surface image taking section operable to take an image of a lower surface of the electronic component being suction-held by the suction-holding nozzle when the lower-surface image taking section passes beneath each of the suction-holding nozzles during the scanning operation of the scanning unit; and lower-surface image-sensing means operable to capture an image of the lower surface of the electronic component introduced through the lower-surface image taking section, wherein the scanning unit has a shape configured, in terms of a large-size electronic component having a size exceeding an image-capturing region determined by the lower-surface image taking section and the lower-surface image-sensing means, to be spaced apart from each of the suction-holding nozzles by a given distance, to avoid interference with the large-size electronic component being suction-held by at least one of the suction-holding nozzles, during the scanning operation of the scanning unit.

In this aspect, even in case where the large-size electronic component requiring image recognition using a fixed camera is attached to at least one of the suction-holding nozzles, the scanning operation for the electronic components attached to the remaining suction-holding nozzles can be performed under a condition that the scanning unit is arranged adjacent to a lower surface of each of the remaining suction-holding nozzles as close as possible, while avoiding interference with the large-size electronic component. Thus, the large-size electronic component can be mixedly transferred together with the electronic components to be subjected to the image-sensing operation using the scanning unit. This makes it possible to allow the component-recognizing apparatus to achieve high flexibility in terms of sequence during transfer of the electronic components, and excellent transfer efficiency.

The present invention also provides a surface-mounting apparatus equipped with the component-recognizing apparatus in accordance with any one of the above aspects.

The present invention further provides a component-inspecting apparatus equipped with the component-recognizing apparatus in accordance with any one of the above aspects.

These and other objects, features and advantages of the present invention will become more apparent upon reading the following detailed description along with the accompanying drawings.

BEST MODE FOR CARRYING OUT THE INVENTION

With reference to the drawings, the best mode for carrying out the present invention will now be specifically described.

Figure 1:
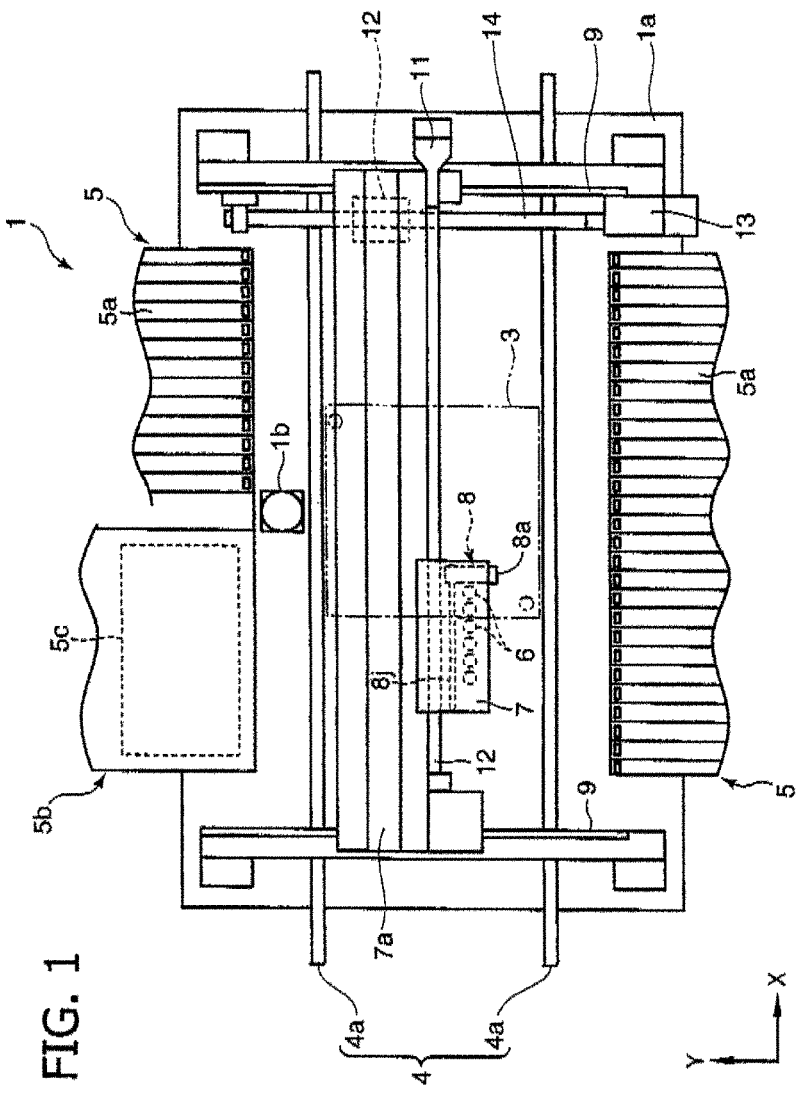
FIG. 1 is a top plan view showing a schematic structure of a surface-mounting apparatus according to one embodiment of the present invention.
Figure 2:
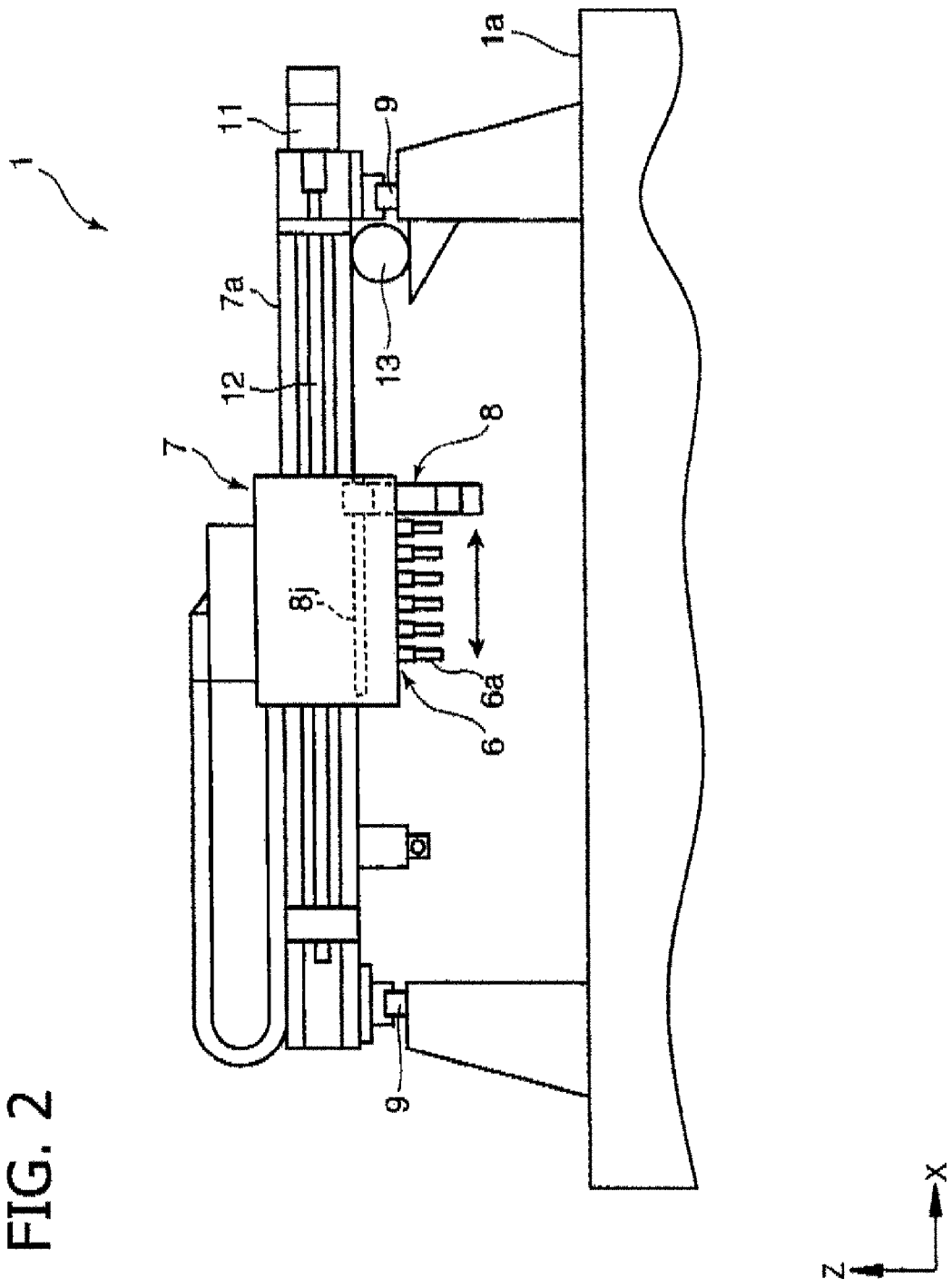
FIG. 2 is a side view showing the schematic structure of the surface-mounting apparatus.

As shown in FIGS. 1 and 2, a surface-mounting apparatus 1 according to one embodiment of the present invention is equipment for mounting a small-size electronic component 2 (FIG. 3) and a large-size electronic component 2a (FIG. 3) onto a board 3, wherein the surface-mounting apparatus 1 comprises board-conveying means 4 disposed on a base 1a to convey the board 3, a component feed section 5 operable to feed a plurality of the electronic components 2 and a plurality of the large-size electronic components 2a, and a head unit 7 adapted to be movable between the component feed section 5 and the board 3, while supporting a suction-holding nozzle 6a (FIG. 2) capable of picking up and holding one of the electronic components 2 and the large-size electronic components 2a from the component feed section 5, by suction.

The surface-mounting apparatus 1 is further equipped with a component-recognizing apparatus 8 according to the present invention, as a means to perform image recognition of suction-held conditions of the electronic component 2 being suction-held by the suction-holding nozzle 6a of the head unit 7, and a fixed camera 1b disposed on the base 1a, as a means to perform image recognition of suction-held conditions of the large-size electronic component 2a being suction-held by the suction-holding nozzle 6a.

Specifically, the board-conveying means 4 has a pair of conveyers 4a and 4a operable to convey the board 3 along an upper surface of the base 1a in a direction from a right side to a left side in FIG. 1, wherein the board 3 carried by the conveyers 4a and 4a is temporarily stopped at a given mounting position (position of the board 3 illustrated in FIG. 1) where the electronic component 2 and the large-size electronic component 2a are mounted onto the board 3.

The component feed section 5 is provided with a large number of tape feeders 5a operable to feed the plurality of electronic components 2, and a tray feeder 5b operable to feed the plurality of large-size electronic components 2a, on both sides of the board-conveying means 4.

Each of the tape feeders 5a has a reel wound by a tape which contains and holds the small-piece or chip-shaped electronic components 2, such as ICs, transistors or capacitors, at given intervals, wherein the tape feeder 5a is adapted to allow the electronic components 2 to be intermittently fed out from the reel and picked up by the suction-holding nozzle 6a of the head unit 7.

The tray feeder 5b internally houses a rectangular-shaped tray 5c on which the large-size electronic components, such as QFPs, are placed, wherein tray feeder 5b is adapted to slidably eject the tray 5c so as to allow one of the large-size electronic components to be picked up by the suction-holding nozzle 6a of the head unit 7. Although not illustrated in detail, the tray 5c has an upper surface provided with a plurality of component receiving portions in a matrix arrangement, and the large-size electronic components 2a are received in respective ones of the component receiving portions.

An image for image recognition of suction-held conditions of the large-size electronic component 2a being suction-held by the suction-holding nozzle 6a is taken by the fixed camera 1b disposed on the base 1a, from below the large-size electronic component 2a.

The head unit 7 is designed to transport the electronic component 2 picked up from the tape feeders 5a or the large-size electronic component 2a picked up from the tray feeder 5b to the board 3, while suction-holding it by the suction-holding nozzle 6a. In this embodiment, the head unit 7 includes six mounting heads 6 each provided with the suction-holding nozzle 6a and arranged in a row at even intervals along an X-axis direction (a conveyance direction of the board-conveying means 4).

Each of the suction-holding nozzles 6a is adapted to be selectively connected to a vacuum generator (not shown) to create a vacuum state at a tip thereof so as to detachably suction-hold the electronic component 2 by the resulting vacuum suction force.

Each of the suction-holding nozzles 6a is also adapted to be movable up and down (movable in a Z-axis direction) relative to the head unit 7 according to nozzle up-down movement driving means (not shown), and rotatable about a central axis thereof (rotatable about an R axis) according to nozzle-rotation driving means (not shown).

The nozzle up-down movement driving means is designed to move the suction-holding nozzle 6a up and down between a lowermost position for a pickup operation and a mounting operation, and an uppermost position for a transfer operation and an image-sensing operation. The nozzle-rotation driving means is designed to rotate the suction-holding nozzle 6a according to need to adjust a conditions of the electronic component 2. Each of the nozzle up-down movement driving means and the nozzle-rotation driving means is in the form of a servomotor and a given driving-force transmitting mechanism.

Further, the head unit 7 is operable to transfer two or more electronic components 2 and at least one large-size electronic component 2a being suction-held by the respective suction-holding nozzles 6a between the component feed section 5 and the board 3, and mount the electronic components 2 and the large-size electronic component 2a onto the board 3 one-by-one. For this purpose, the head unit 7 is adapted to be movable over a given region of the base 1a, in the X-axis direction and a Y-axis direction (direction perpendicular to the X-axis direction).

More specifically, the head unit 7 is supported relative to a mounting-head support member 7a extending in the X-axis direction, in such a manner as to be movable along the X-axis. The mounting-head support member 7a has opposite ends each supported by a fixed rail 9 extending in the Y-axis direction, so that it is movable in the X-axis direction along the fixed rails 9. Further, the head unit 7 is adapted to be drivenly moved in the X-axis direction by an X-axis servomotor 11, and the mounting-head support member 7a is adapted to be drivenly moved in the Y-axis direction by a Y-axis servomotor 13 through a ball screw 14.

Figure 3:
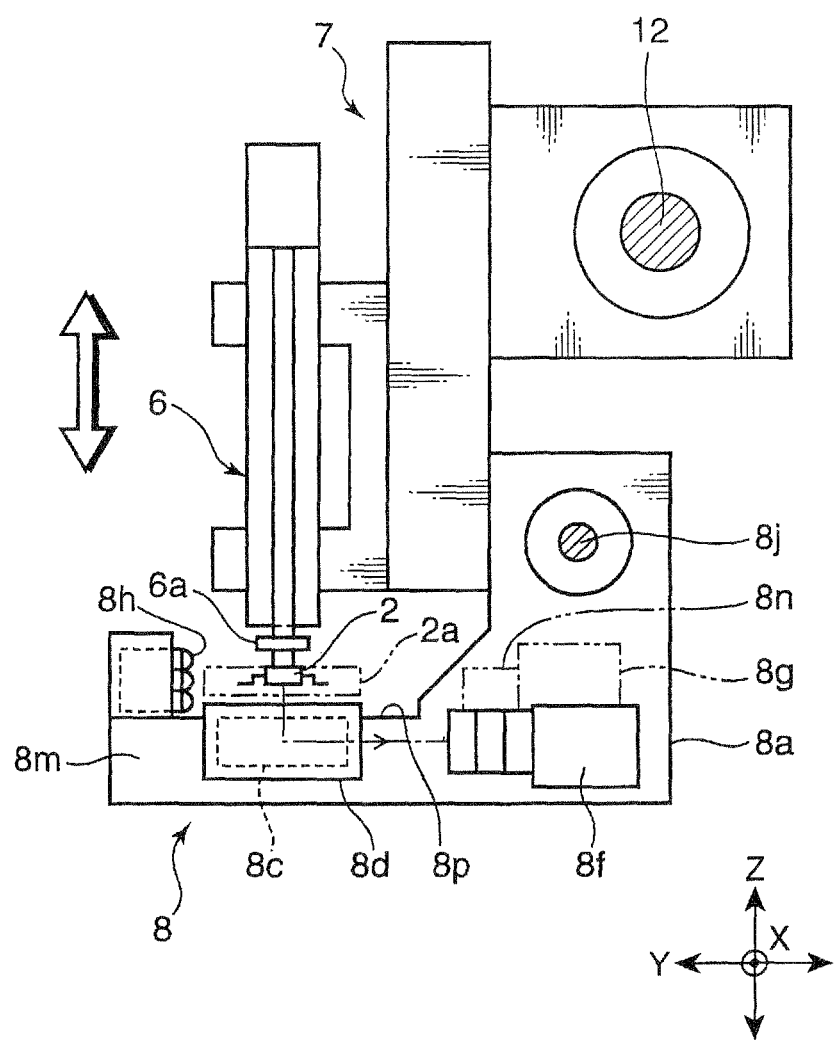
FIG. 3 is a side view showing a structure of a component-recognizing apparatus according to one embodiment of the present invention.
Figure 4:
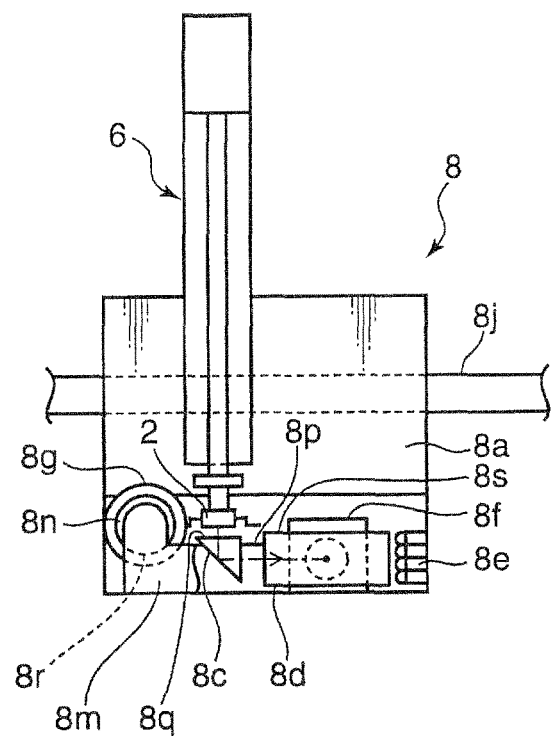
FIG. 4 is a front view showing the structure of the component-recognizing apparatus.
Figure 5:
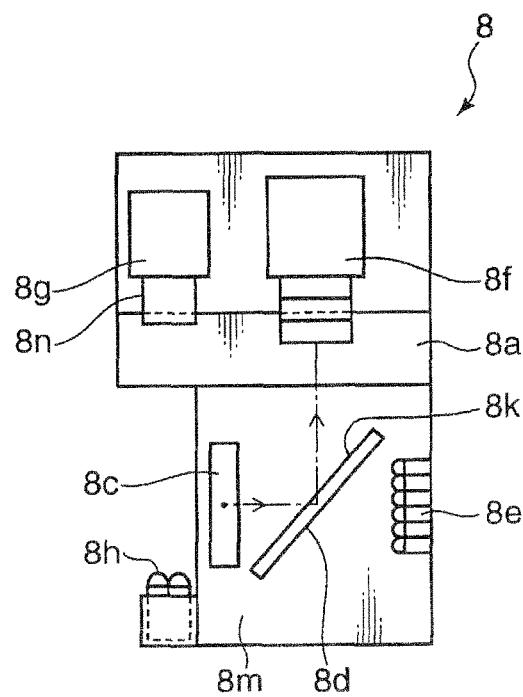
FIG. 5 is a top plan view showing the structure of the component-recognizing apparatus.

As shown in FIGS. 3 to 5, the component-recognizing apparatus 8 comprises, as a main element, a scanning unit 8a which is installed to the head unit 7 to capture an image for image recognition of suction-held conditions of each of the electronic components 2 being suction-held by the suction-holding nozzles 6a, in a sequential manner, during a course of transferring the electronic components 2 from the component feed section 5 to a target position by the head unit 7. The scanning unit 8a is formed with a lower-surface image taking section 8b, and internally provided with a first optical path changing member 8c, a second optical path changing member 8d, lower-surface illumination means 8e, and lower-surface image-sensing means 8f operable to capture an image of a lower surface of each of the electronic components 2 which strikes through the lower-surface image taking section 8b. The first optical path changing member 8c and the second optical path changing member 8d are supported by a support member 8m of the scanning unit 8a.

The component-recognizing apparatus 8 further comprises side-area image-sensing means 9g and side illumination means 8h which are integrated with the scanning unit 8a.

The scanning unit 8a is a module installed to the head unit 7 and adapted to be movable approximately parallel to a row direction of the suction-holding nozzles 6a by a servomotor (not shown) through a ball screw 8j. For scanning an image of the electronic component 2 falling within an image-capturing region (i.e., afield of view) determined by the lower-surface image taking section 8b and the lower-surface image-sensing means 8f in a given region equal to or greater than a region to be opposed to the large-size electronic component, the scanning unit 8a has a recess that maintains a given distance from each of the suction-holding nozzles 6a to avoid interference with the large-size electronic component 2a.

As above, in this embodiment, the scanning unit 8a has a particular shape configured, in terms of the large-size electronic component 2a having a size exceeding the image-capturing region determined by the lower-surface image taking section 8b and the lower-surface image-sensing means 8f, to be spaced apart from each of the suction-holding nozzles 6a by a given distance, to avoid interference with the large-size electronic component 2a being suction-held by the suction-holding nozzle 6a, during the movement of the scanning unit 8a.

Figure 6:
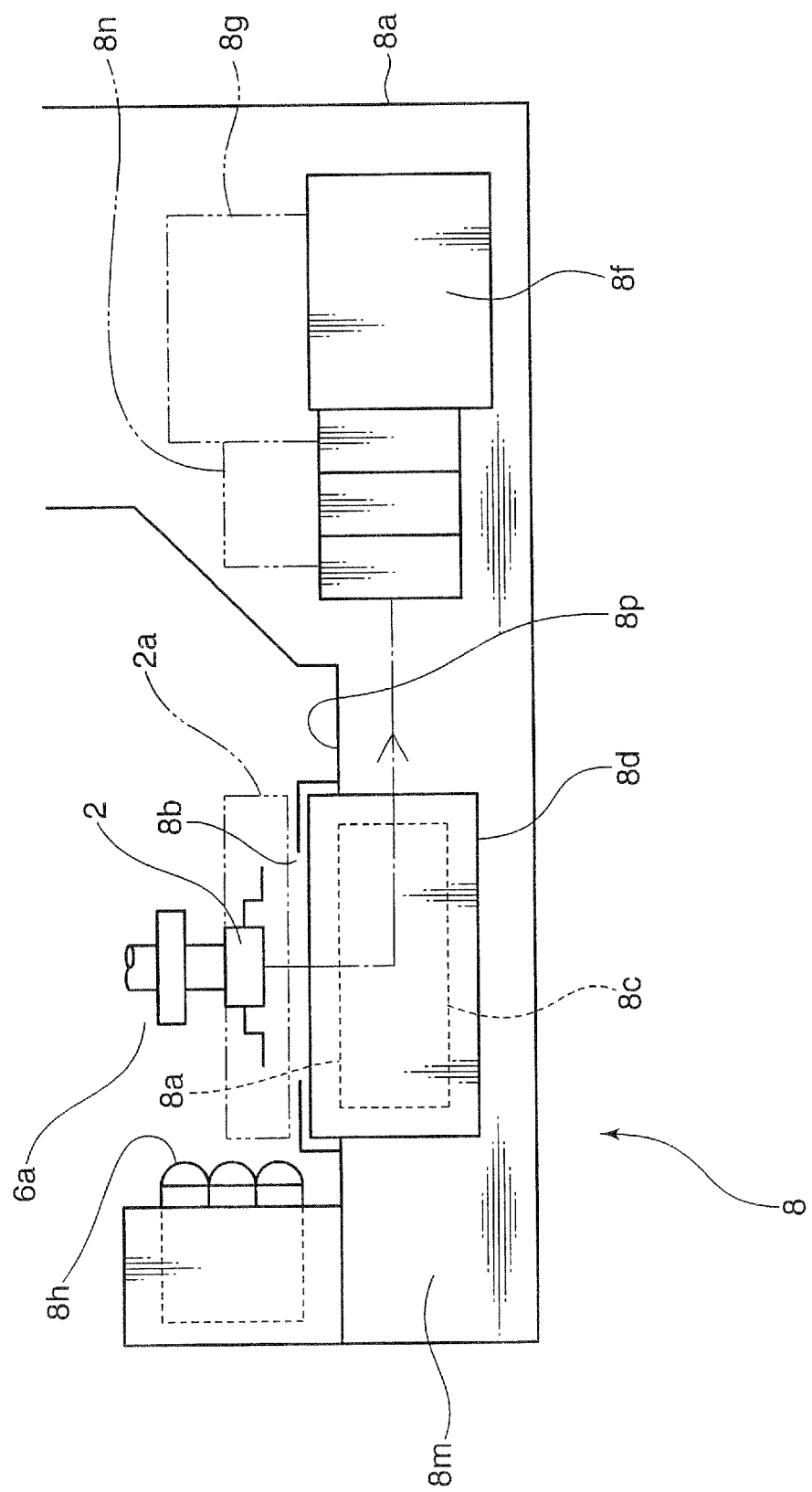
FIG. 6 is a fragmentary side view enlargedly showing a substantial part of the component-recognizing apparatus.

The lower-surface image taking section 8b is a portion of the scanning unit 8a, which is operable, when it passes beneath each of the suction-holding nozzles 6a during the movement of the scanning unit 8a, to capture an image of a lower surface of the electronic component 2 being suction-held by the suction-holding nozzle 6a. In this embodiment, the lower-surface image taking section 8b is embodied by an oblong or rectangular-shaped slit formed in the scanning unit 8a. The slit as the lower-surface image taking section 8b is located between the first optical path changing member 8c and the suction-holding nozzle 6a, to prevent disturbance light from entering the lower-surface image-sensing means 8f (see FIG. 6).

The first optical path changing member 8c is adapted to be located beneath each of the suction-holding nozzles 6a, wherein the first optical path changing member 8c is operable to change the optical path directed downwardly from the suction-holding nozzle 6a, approximately horizontally/laterally by about 90 degrees, so as to change the optical path in a lateral direction from beneath the suction-holding nozzle 6a. In this embodiment, the first optical path changing member 8c is in the form of a reflecting prism.

The second optical path changing member 8d is an optical device operable to change further the optical path from the first optical path changing member 8c by about 90 degrees, so as to further bend the optical path bended by the first optical path changing member 8c, in another direction. In this embodiment, the second optical path changing member 8d is in the form of a half mirror. Thus, the optical path changing surface 8k functions as a translucent surface with respect to light from behind an optical path changing surface 8k, to allow the light of the illumination means 8e provided behind an optical path changing surface 8k, to pass therethrough forwardly.

Further, as shown in FIG. 4, the support member 8m supporting the first optical path changing member 8c and the second optical path changing member 8d is formed and arranged such that an upper surface 8p thereof is located below an upper surface 8q of the first optical path changing member 8c and an upper surface 8s of the second optical path changing member 8d.

The lower-surface illumination means 8e is a device operable to emit illumination light toward the electronic component 2 being suction-held by the suction-held nozzle 6a, through the first optical path changing member 8c and the second optical path changing member 8d, so as to illuminate the lower surface of the electronic component 2, and embodied by a plurality of light-emitting diodes. In this embodiment, the lower-surface illumination means 8e is provided approximately on an extension line of the light directed from the first optical path changing member 8c toward the second optical path changing member 8d, so as to emit the illumination light from behind an optical path changing surface 8k of the second optical path changing member 8d, toward the first optical path changing member 8c. As above, the lower-surface illumination means 8e is adapted to illuminate the lower surface of the electronic component 2 being suction-held by the suction-holding nozzle 6a, with the illumination light bended by the first optical path changing member 8c after passing through the optical path changing surface 8k of the second optical path changing member 8d.

The lower-surface image-sensing means 8f is a camera adapted to capture an image of the electronic component 2 being suction-held by the suction-holding nozzle 6a and illuminated by the lower-surface illumination means 8e, through the first optical path changing member 8c and the second optical path changing member 8d. For example, the lower-surface image-sensing means 8f may be in the form of a CCD line sensor camera. The lower-surface image-sensing means 8f is disposed such that an image-taking direction thereof is oriented laterally to face the optical path changed by the second optical path changing member 8d.

The side-area image-sensing means 8g is a camera disposed lateral to the lower-surface image-sensing means 8f and adapted to capture an image of the electronic component 2 from a lateral side of the electronic component 2. For example, the side-area image-sensing means 8g may be in the form of a CCD line sensor camera, as with the lower-surface image-sensing means 8f.

A lower end 8r of a side-image taking section 8n for the side-area image-sensing means 8g is located below the upper surface 8q of the first optical path changing member 8c and the upper surface 8s of the second optical path changing member 8d.

The side illumination means 8h is a device operable to illuminate a side surface of the electronic component 2, wherein a plurality of light-emitting diodes is employed. The plurality of light-emitting diodes are disposed on the side of a distal end of the scanning unit 8a formed in a concave shape to avoid interference with the large-size electronic component 2a.

Figure 7:
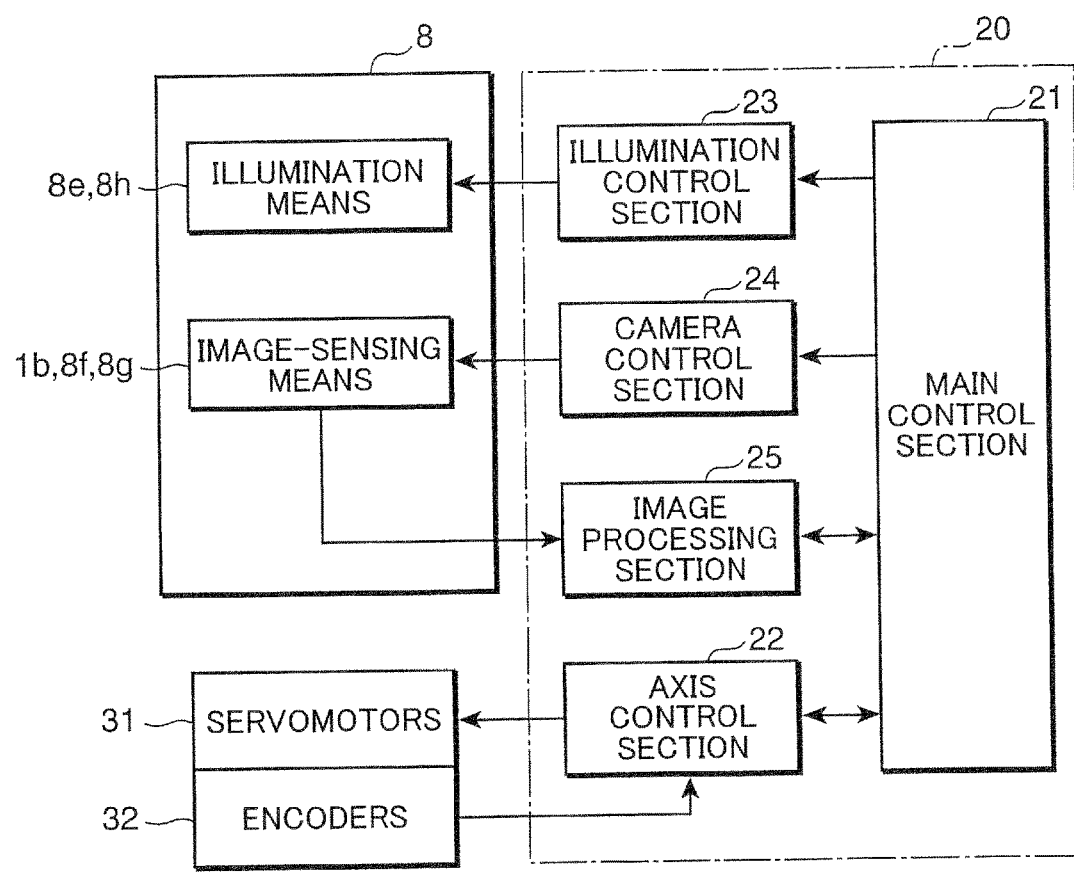
FIG. 7 is a block diagram showing a schematic configuration of a control unit of the component-recognizing apparatus.

During a course of transferring the electronic component 2 from the component feed section 5 to the board 5 after picking up the electronic component 2 in the component feed section 5 by the suction-holding nozzle 6a, the lower-surface image-sensing means 8f and the side-area image-sensing means 8g take images of the electronic component 2 being suction-held by the suction-holding nozzle 6a, and the taken images (a reflection image of the lower surface of the electronic component 2, and a transmitted image of the lateral surface of the electronic component 2) are subjected to an image processing using an image processing device 23 of a control unit 20 (FIG. 7).

An image of suction-held conditions of the large-size electronic component 2a being suction-held by the suction-holding nozzle 6a is taken by the fixed camera 1b disposed on the base 1a. For example, the fixed camera 1b is in the form of a CCD camera adapted to perform image recognition of the large-size electronic component 2a from below the suction-holding nozzle 6a, during a course of transferring the large-size electronic component 2a from the tray feeder 5b to the board 3 after picking up the large-size electronic component 2a by the suction-holding nozzle 6a.

With reference to FIG. 7, the control unit 20 of the surface-mounting apparatus 1 will be described below.

As shown in FIG. 7, in terms of a functional configuration, the control unit 20 comprises a main control section 21, an axis control section 22, an illumination control section 23, a camera control section 24, and an image processing section 25.

The main control section 21 is designed to generally control an operation of the surface-mounting apparatus 1, and comprises a commonly-known CPU for executing logical operations, a ROM pre-storing various programs for controlling the CPU, and a RAM for temporarily storing various data during an operation of the surface-mounting apparatus 1. The main control section 21 is operable to control various devices, such as the board-conveying means 4, the component feed section 5, the mounting heads 6, the head unit 7 and the component-recognizing apparatus, according to the pre-stored programs.

The axis control section 22 is operable to control driving of various servomotors 31, such as the X-axis servomotor 11, the Y-axis servomotor 13, and the servomotor for the scanning unit 8a, while communicating control signals with the main control section 21. Each of the servomotors 31 is provided with an encoder 32 which is operable to detect a movement position of the associated unit or member, and feed back the detected position to the axis control section 22 as a control signal.

The illumination control section 23 is operable to control the lower-surface illumination means 8e for the lower-surface image-sensing means 8f in conjunction with the operation of taking an image of the electronic component 2 by the lower-surface image-sensing means 8f, while communicating control signals with the main control section 21.

The camera control section 24 is operable to control the lower-surface image-sensing means 8f of the component-recognizing apparatus 8, while communicating control signals with the main control section 21.

The image processing section 25 is operable to subject an image signal output from the lower-surface image-sensing means 8f, to a given processing to create image data suitable for component recognition, and output the image data to the main control section 21. Then, the main control section 21 is operable to perform an arithmetical operation, such as calculation of deviation in suction-held conditions (pickup error) based on the image data output from the image processing section 25.

With reference to FIGS. 1 to 7, functions of the surface-mounting apparatus 1 according to this embodiment will be described below.

In the surface-mounting apparatus 1 according to this embodiment, the control unit 20 generally controls an operation of each section of the surface-mounting apparatus.

First, as shown in FIG. 1, the pair of conveyers 4a and 4a of the board-conveying means 4 carry the board 3 to the given mounting position (position of the board 3 illustrated in FIG. 1) on the base 1a. The board 3 is temporarily stopped at the mounting position.

Further, the head unit 7 is moved from the component feed section 5 to the board 3, while suction-holding the electronic components 2 fed from the component feed section 5 by the respective suction-holding nozzles 6a, to mount the electronic components 2 onto the board 3.

During a course of transferring the electronic components 2 being suction-held by the respective suction-holding nozzles 6a, from the component feed section 5 to the target position by the head unit 7, the scanning unit 8a of the component-recognizing apparatus 8 is moved along the row of suction-holding nozzles 6a, so that the lower-surface image-sensing means 8f and the side-area image-sensing means 8g take images of suction-held conditions of the electronic component 2 in each of the suction-holding nozzles 6a in a sequential manner to perform image recognition.

An image-taking procedure of the lower-surface image-sensing means 8f is as follows.

When the illumination means 8e controlled by the illumination control section 23 emits illumination light from behind an optical path changing surface 8k of the second optical path changing member 8d, toward the first optical path changing member 8c, the illumination light is reflected by the first optical path changing member 8c after passing through the optical path changing surface 8k of the second optical path changing member 8d, to illuminate a lower surface of the electronic component 2 being suction-held by the suction-holding nozzle 6a.

During this process, the slit as the lower-surface image taking section 8b narrows a light-passing area to limit the illumination light from the illumination means 8e, to an image-capturing region.

Then, during an image-sensing operation, the first optical path changing member 8c provided beneath the suction-holding nozzle 6a changes the optical path directed downwardly from the suction-holding nozzle 6a to approximately horizontally lateral side by about 90 degrees, so as to change the optical path in a lateral direction from beneath the suction-holding nozzle 6a, and then the second optical path changing member 8d further changes the optical path from the first optical path changing member 8c by about 90 degrees, to bend the bended optical path in another direction. Then, the lower-surface image-sensing means 8f provided in the scanning unit 8a and controlled by the camera control section 24 receives the resulting light to capture an image of the lower surface of the electronic component 2.

As above, the lower-surface image-sensing means 8f is adapted to take a reflection image of a lower surface of the electronic component 2 being suction-held by the suction-holding nozzle 6a and illuminated by the lower-surface illumination means 8e, through the first optical path changing member 8c and the second optical path changing member 8d.

Further, the side-area image-sensing means 8g is disposed lateral to the lower-surface image-sensing means 8f, and adapted to take a transmitted image of the electronic component 2 from a lateral side of the electronic component 2.

Then, the taken images (the reflection image of the lower surface of the electronic component 2, and the transmitted image of the lateral surface of the electronic component 2) are subjected to an image processing using the image processing device 23 (FIG. 3) provided in the control unit 20, to create image data suitable for component recognition. Then, the main control section 21 performs an arithmetical operation, such as calculation of deviation in suction-held conditions (pickup error) based on the image data output from the image processing section 25.

In case where the large-size electronic component 2a is suction-held by some of the suction-holding nozzles 6a, and the small-size electronic components 2 are suction-held by the rest of the suction-holding nozzles 6a, to transfer the electronic components 2 and 2a in a mixed manner, the small-size electronic components 2 are subjected to component recognition using the scanning unit 8a in the above manner after the component pickup operation, and, before or after the component recognition, an image of the large-size electronic component 2a is taken by the fixed camera 1b to perform image recognition. Then, the components 2 and 2a are sequentially mounted onto the board 3.

In this embodiment, the scanning unit 8a has a shape configured to be spaced apart from each of the suction-holding nozzles by a given distance, to avoid interference with the large-size electronic component 2a being suction-held by the suction-holding nozzle 6a, during movement of the scanning unit 8a, in a given region equal to or greater than a region to be opposed to the large-size electronic component 2a. Thus, even in the case where the small-size electronic components 2 and the large-size electronic component 2a requiring image recognition using the fixed camera 1b are mixedly transferred by the head unit 7, the two types of electronic components can be transferred while avoiding interference between the scanning unit 8a and the large-size electronic component 2a being suction-held by the suction-holding nozzle 6a. This makes it possible to allow the component-recognizing apparatus to achieve high flexibility in terms of transfer sequence, and excellent transfer efficiency.

Further, the scanning unit 8a has a recess that maintains a given distance from each of the suction-holding nozzles 6a to avoid interference with the large-size electronic component 2a. This makes it possible to more reliably avoid interference between the scanning unit 8a and the large-size electronic component 2a being suction-held by the suction-holding nozzle 6a.

As described above, in the surface-mounting apparatus 1 according to the above embodiment of the present invention, the illumination means is operable to emit illumination light onto the lower surface of the electronic component being suction-held by the suction-holding nozzle, along at least the lateral optical path changed by the first optical path changing member. This makes it possible to eliminate a need for providing the lower-surface illumination means 8e beneath the suction-holding nozzle 6a. Therefore, a thickness of the component-recognizing apparatus 8 including the lower-surface illumination means 8e and an optical system can be reduced without performance degradation, such as narrowing in field of view of the lower-surface image-sensing means 8f and reduction in lens brightness due to downsizing of the optical system and a lens. In addition, a height dimension of the head unit 7 can be reduced to downsize intended equipment in its entirety and facilitate a reduction in installation space of the equipment.

The optical path changing surface 8k of the second optical path changing member 8d is made as a translucent surface, to allow the lower surface of the electronic component 2 being suction-held by the suction-holding nozzle 6a to be illuminated with illumination light from the lower-surface illumination means 8e provided behind an optical path changing surface 8k. This makes it possible to package the lower-surface illumination means 8e behind an optical path changing surface 8k to further downsize the component-recognizing apparatus 8.

Particularly in the above embodiment, the first optical path changing member 8c, the second optical path changing member 8d, the lower-surface image-sensing means 8f, and the lower-surface illumination means 8e are integrally provided in the scanning unit 8a, and the scanning unit 8a is adapted to be movable approximately parallel to the row of suction-holding nozzles 6a. This makes it possible to allow the component-recognizing apparatus 8 to take respective images of the plurality of suction-holding nozzles 6a arranged in a row, and achieve a reduced thickness and a reduced installation space.

Each of the first optical path changing member 8c and the second optical path changing member 8d is operable to change the optical path by about 90 degrees, so that an appropriate angular change in optical path and an appropriate width in field of view can be obtained.

Further, in the above embodiment, the optical path changing surface 8k of the second optical path changing member 8d is in the form of a half mirror which is relatively low in cost, so that a cost of the optical system can be reduced.

The lower-surface image taking section 8b is likewise embodied by the slit which is provided between the suction-holding nozzle 6a and the first optical path changing member 8c to restrict a light-passing area. This makes it possible to prevent excess light from entering the lower-surface image-sensing means 8f from a region other than the image-capturing region, so as to obtain a clear image free of flare.

As above, the surface-mounting apparatus 1 of the present invention is equipped with the above component-recognizing apparatus 8, as a means to perform the image recognition of the conditions of electronic component 2 being suction-held by the suction-holding nozzle 6a. This makes it possible to allow the surface-mounting apparatus to transfer the small-size electronic components 2 and the large-size electronic component 2a being suction-held by the respective suction-holding nozzles 6a, while avoiding interference between the scanning unit 8a and the large-size electronic component 2a, so as to achieve high flexibility in terms of transfer sequence, and excellent transfer efficiency.

Further, as shown in FIG. 4, the upper surface 8p of the support member 8m supporting the first optical path changing member 8c is located below the upper surface 8q of the first optical path changing member 8c, so that, when each of the suction-holding nozzles 6a passes above the upper surface 8q of the first optical path changing member 8c during the scanning operation, no interference with the support member 8m occurs. Thus, a position of each of the suction-holding nozzles 6a during the scanning operation can be set closer to the target position and the component feed section in a vertical direction by just the margin, and therefore a mounting time in the target position and a pickup time in the component feed section can be cut down.

In addition, the scanning unit 8a is provided with the side-area image-sensing means 8g, so that suction-held conditions can be detected based on a lateral-surface image. In case of adding this function, the lower end 8r of the side-image taking section 8n is located below the upper surface 8q of the first optical path changing member 8c, so that the mounting time in the target position and the pickup time in the component feed section are never increased.

The above embodiment has been shown simply by way of one illustrative embodiment of the present invention, and the present invention is not limited to the above embodiment.

Figure 8:
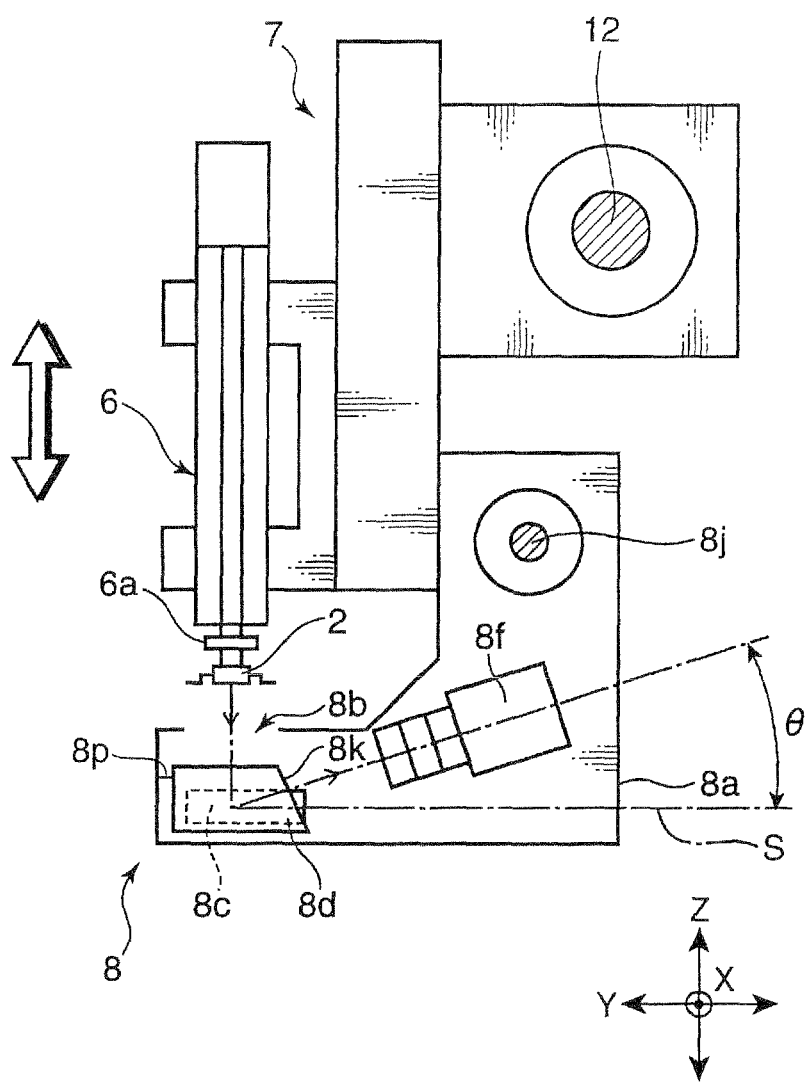
FIG. 8 is a side view showing a structure of a component-recognizing apparatus according to another embodiment of the present invention.
Figure 9:
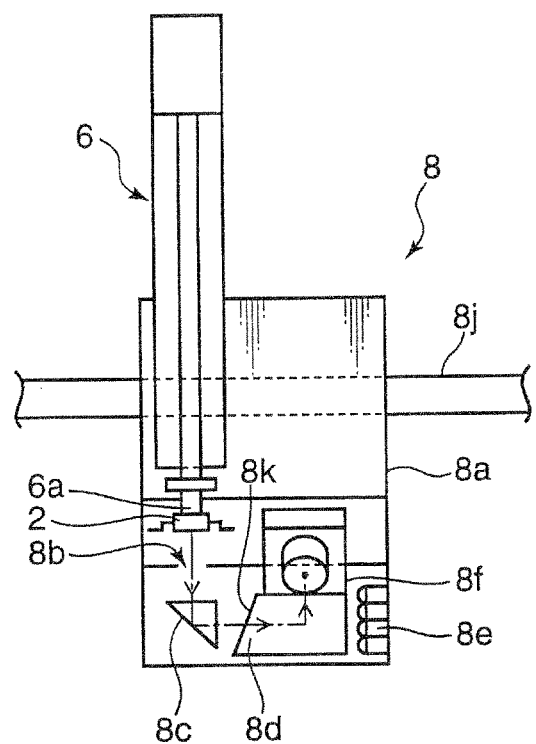
FIG. 9 is a front view showing the structure of the component-recognizing apparatus according to the embodiment in FIG. 8.
Figure 10:
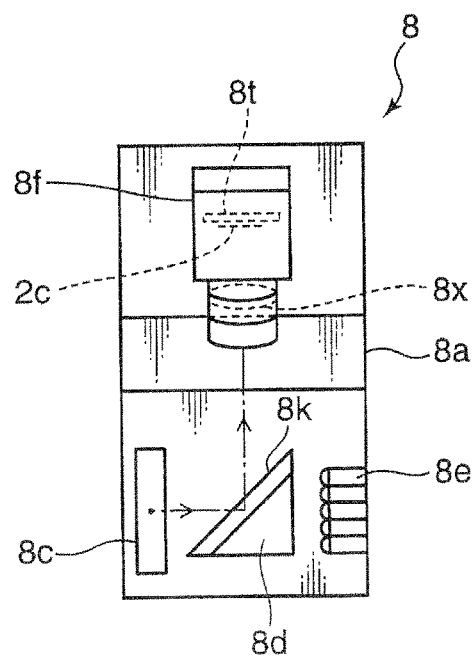
FIG. 10 is a top plan view showing the structure of the component-recognizing apparatus according to the embodiment in FIG. 8.

Referring to FIGS. 8 to 10, each of the first and second optical path changing members 8c and 8d illustrated in FIGS. 8 to 10 is in the form of a reflecting prism. The second optical path changing member 8d is an optical device operable to further bend a bended optical path from the suction-holding nozzle 6a through the first optical path changing member 8c in another direction, in such a manner as to be changed to the optical path directed upwardly at a given elevation angle relative to a horizontal plane S. In this embodiment, the optical path changing surface 8k is formed to be inclined with respect to the horizontal plane S. Further, the side-area image-sensing means 8f is provided in the scanning unit 8*a* in such a manner that an image-taking direction thereof is inclined to face the optical path changed by the second optical path changing member 8*d*.

Figure 11A:
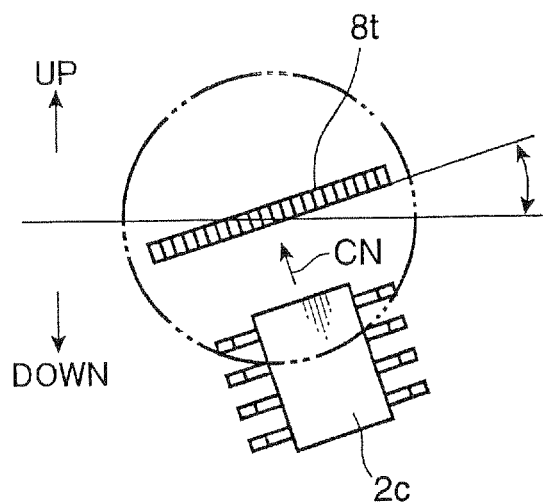
FIG. 11A is an explanatory diagram showing a relationship between an arrangement of an image sensor of a line sensor and an image of an electronic component obtained on the image sensor via a lens, in case where the image sensor is arranged to be inclined with respect to a horizontal direction in such a manner that an arrangement direction of the image sensor is set approximately perpendicular to a movement direction of the image of the electronic component according to the embodiment in FIG. 8.
Figure 11B:
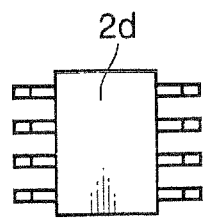
FIG. 11B is an explanatory diagram showing that a taken image is formed as a non-distorted image in case of FIG. 11A.
Figure 12A:
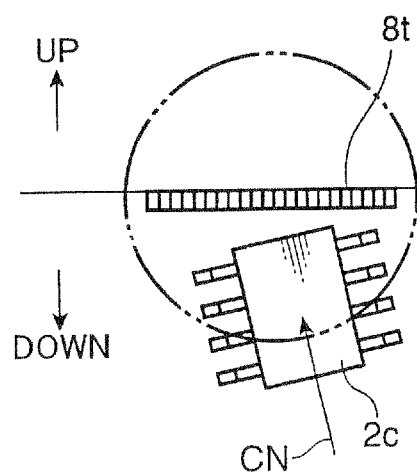
FIG. 12A is an explanatory diagram for case where the image sensor of line sensor in the embodiment in FIG. 8 are arranged in a horizontal direction.
Figure 12B:
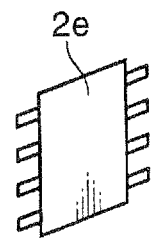
FIG. 12B is an explanatory diagram showing that a taken image is formed as a distorted image in the case where the image sensor of the line sensor in the embodiment in FIG. 8 are arranged in a horizontal direction.

Referring to FIGS. 11 and 12, in this embodiment, considering that an image 2*c* of the electronic component 2 is inclined with respect to a horizontal direction, an arrangement direction of a plurality of image sensor 8*t* is inclined with respect to the horizontal direction in such a manner that the image sensor 8*t* is arranged in a direction approximately perpendicular to a movement direction CN along which the image 2*c* of the electronic component 2 is moved on the image sensor 8*t* as the scanning unit moves 8*a* along the row of the suction-holding nozzles, as shown in FIG. 11A. If the arrangement of image sensor 8*t* of a line sensor is set to be horizontal (FIG. 12A), a taken image is distorted as an image 2*e* (FIG. 12B). In contrast, in this embodiment, a non-distorted image can be formed as an image 2*d* in FIG. 11B.

An image-taking procedure of the side-area image-sensing means 8*f* in the embodiment illustrated in FIGS. 8 to 10 is as follows.

The lower-surface illumination means 8*e* controlled by the illumination control section 23 illuminates a lower surface of the electronic component 2 being suction-held by the suction-holding nozzle 6*a*.

Then, during an image-sensing operation, the first optical path changing member 8*c* located beneath the suction-holding nozzle 6*a* changes the optical path directed downwardly from the suction-holding nozzle 6*a* to approximately horizontally lateral side by about 90 degrees, so as to change the optical path in a lateral direction from beneath the suction-holding nozzle 6*a*.

Then, the second optical path changing member 8*d* further bends the bended optical path from the suction-holding nozzle 6*a* through the first optical path changing member 8*c*, in another direction, in such a manner as to be changed to the optical path directed upwardly at the given elevation angle relative to the horizontal plane S.

Then, the side-area image-sensing means 8*f* provided in the scanning unit 8*a* and controlled by the camera control section 24 receives the resulting light to capture an image of the lower surface of the electronic component 2.

As above, the side-area image-sensing means 8*f* is adapted to capture an image of a lower surface of the electronic component 2 being suction-held by the suction-holding nozzle 6*a* and illuminated by the lower-surface illumination means 8*e*, through the first optical path changing member 8*c* and the second optical path changing member 8*d*.

As described above, in the component-recognizing apparatus 8 according to the above embodiment of the present invention, the lower-surface image-sensing means is disposed in the optical path which is changed by the second optical path changing member in such a manner as to be directed upwardly at the given elevation angle relative to the horizontal plane S. This makes it possible to avoid a situation where the lower-surface image-sensing means is provided to extend below the second optical path changing member. Therefore, an opposed distance between the head unit and the base can be reduced to downsize intended equipment in its entirety and facilitate a reduction in installation space of the equipment, while employing a lens of normal size, without performance degradation, such as narrowing in field of view of the lower-surface image-sensing means and reduction in lens brightness due to downsizing of the optical system and the lens.

Each of the first optical path changing member and the second optical path changing member is operable to change the optical path by about 90 degrees, so that an appropriate angular change in optical path and an appropriate width in field of view can be obtained.

Further, the first optical path changing member is in the form of a prism, so that a low-cost optical system can be achieved in terms of the first optical path changing member.

The second optical path changing member is also in the form of a prism, so that a low-cost optical system can also be achieved in terms of the second optical path changing member.

The image sensor of image sensor 8*t* of the line sensor of the side-area image-sensing means 8*f* are arranged to be inclined with respect to a horizontal direction in such a manner that a direction of the image sensor is set approximately perpendicular to a movement direction along which the image 2*c* of the electronic component 2 is moved on the image sensor 8*t* as the scanning unit moves 8*a* along the row of the suction-holding nozzles. Therefore, a need for taking time to perform an image processing for a taken image 2*d* can be eliminated to prevent deterioration in mounting efficiency.

[Other Modifications]

In the above embodiments, each of the components, such as the board-conveying means 4, the component feed section 5, and the X-axis/Y-axis driving mechanism of the head unit 7, is not intended to limit the present invention, but various design changes may be made therein.

Figure 13:
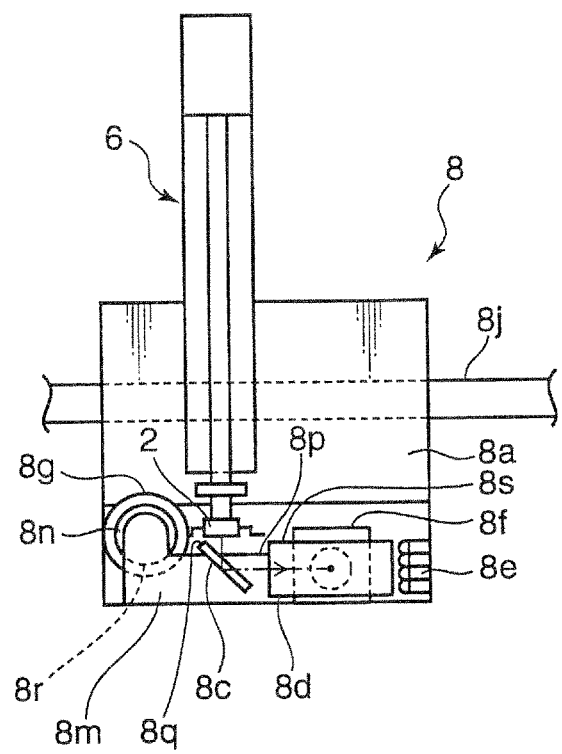
FIG. 13 is a front view showing a structure of a component-recognizing apparatus according to yet another embodiment of the present invention.

Further, as shown in FIG. 13, the first optical path changing member 8*c* may be in the form of a mirror.

Figure 14:
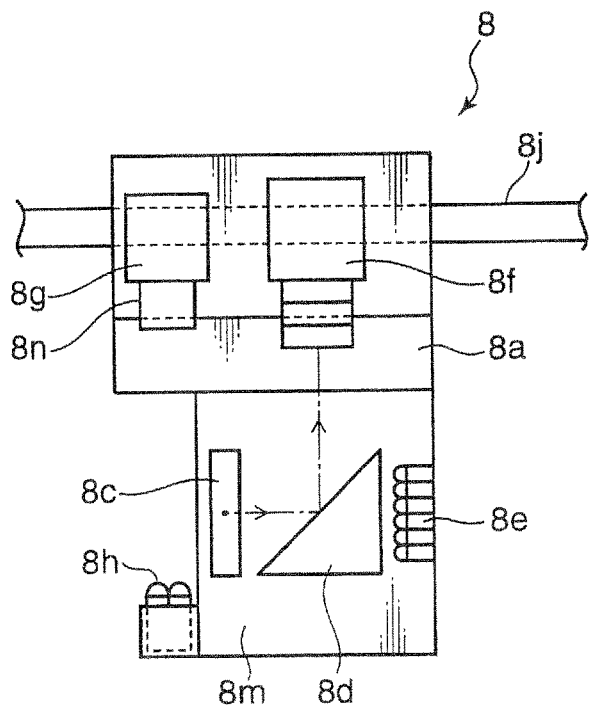
FIG. 14 is a side view showing a structure of a component-recognizing apparatus according to still another embodiment of the present invention.

Alternatively, as shown in FIG. 14, the second optical path changing member 8*d* may be in the form of a prism.

Further, the first optical path changing member 8*c* and the second optical path changing member 8*d* are not necessarily limited to a type operable to change the optical path to approximately horizontally lateral side by about 90 degrees. As long as it is a type provided beneath the suction-holding nozzle 6*a* and operable to change the optical path directed downwardly from the suction-holding nozzle 6*a*, in a lateral direction from beneath the suction-holding nozzle 6*a*, the optical path may be changed in various other ways.

Similarly, each of the lower-surface illumination means 8*e* and the side illumination means 8*h* is not limited to light-emitting diodes. Any other conventional illumination means may be employed.

Further, each of the lower-surface image-sensing means 8*f* and the side-area image-sensing means 8*g* is not limited to a CCD camera, but various other types of cameras may be employed.

The image-taking direction is not necessarily limited to the illustrated direction. Depending on a relationship with a surrounding device, a design change may be made to set it in various directions.

Further, an application of the component-recognizing apparatus according to the present invention is not limited to a surface-mounting apparatus. It may also be applied to a component-inspecting apparatus comprising a movable head unit having a suction-holding nozzle capable of suction-holding an electronic component, wherein the component-inspecting apparatus is adapted to pick up an electronic component from a component feed section by the suction-holding nozzle, and, after taking an image of the electronic component being suction-held by the suction-holding nozzle, to perform image recognition of suction-held conditions of the electronic component relative to the suction-holding nozzle, transfer the electronic component to inspection means to carry out various inspections.

The component-recognizing apparatus may be provided in a line for supplying only the same type of electronic component 2a.

The above component-inspecting apparatus is equipped with the component-recognizing apparatus according to the present invention, as a means to perform the image recognition of the conditions of electronic component being suction-held by the suction-holding nozzle. This makes it possible to allow the component-inspecting apparatus to transfer the small-size electronic components and the large-size electronic component, so as to achieve high flexibility in terms of transfer sequence, and excellent transfer efficiency.

It is understood that the component-inspecting apparatus may be a type adapted to mixedly transfer the large-size electronic component to be subjected to an image-sensing operation using a fixed camera 1b, as with the surface-mounting apparatus 1 in FIG. 1. In this case, the component-recognizing apparatus according to the first embodiment may be employed to allow the component-inspecting apparatus to transfer the small-size electronic components and the large-size electronic component while avoiding interference between the scanning unit and the large-size electronic component being suction-held by the suction-holding nozzle 6a, so as to achieve high flexibility in terms of transfer sequence, and excellent transfer efficiency.

As above, in summary, the present invention provides a component-recognizing apparatus comprising a movable head unit having a suction-holding nozzle capable of suction-holding an electronic component and a scanning unit which is installed to the head unit in relatively displaceable with respect to the suction-holding nozzle, the scanning unit being operable to capture an image for image recognition of suction-held conditions of the electronic component being suction-held by the suction-holding nozzle, said scanning unit including: a first optical path changing member which is adapted to be located beneath the suction-holding nozzle and is operable to bend the optical path directed downwardly from the suction-holding nozzle in a lateral direction during the image-sensing operation; a second optical path changing member operable to further bend the bended optical path in another direction; lower-surface image-sensing means disposed in the optical path changed by the second optical path changing member, the lower-surface image-sensing means is operable to capture an image of a lower surface of the electronic component being suction-held by the suction-holding nozzle through the first and second optical path changing members; and illumination means operable to emit illumination light onto the lower surface of the electronic component being suction-held by the suction-holding nozzle, along at least the lateral optical path changed by the first optical path changing member.

According to the component-recognizing apparatus of the present invention, the illumination means is operable to emit illumination light onto the lower surface of the electronic component being suction-held by the suction-holding nozzle, along at least the lateral optical path changed by the first optical path changing member. This makes it possible to eliminate a need for providing the illumination means beneath the suction-holding nozzle. Therefore, a thickness of the scanning unit can be reduced without performance degradation, such as narrowing in field of view of the lower-surface image-sensing means and reduction in lens brightness due to downsizing of an optical system and a lens. In addition, an opposed distance between the head unit and a base can be reduced to downsize intended equipment in its entirety and facilitate a reduction in installation space of the equipment.

Preferably, in the component-recognizing apparatus of the present invention, the illumination means is provided approximately on an extension line of the light directed from the first optical path changing member toward the second optical path changing member, so as to emit the illumination light from behind an optical path changing surface of the second optical path changing member toward the first optical path changing member, the optical path changing surface of the second optical path changing member is a translucent surface formed as operable to allow the light of the illumination means provided behind an optical path changing surface to pass therethrough forwardly, and the illumination means is adapted to illuminate the lower surface of the electronic component being suction-held by the suction-holding nozzle, with the illumination light bended by the first optical path changing member after passing through the optical path changing surface of the second optical path changing member.

According to this feature, because the optical path changing surface of the second optical path changing member is a translucent surface, it allows the lower surface of the electronic component being suction-held by the suction-holding nozzle to be illuminated with illumination light from the illumination means provided behind an optical path changing surface. This makes it possible to package the illumination means behind an optical path changing surface to further downsize the component-recognizing apparatus.

Preferably, the optical path changing surface of the second optical path changing member is in the form of a half mirror as the translucent surface.

According to this feature, the optical path changing surface of the second optical path changing member is in the form of a half mirror which is relatively low in cost, so that a cost of the optical system can be reduced.

Alternatively, the optical path changing surface of the second optical path changing member is preferably in the form of a reflecting prism as the translucent surface.

According to this feature, the optical path changing surface of the second optical path changing member is in the form of a reflecting prism, so that the optical path changing surface can be used for a long period of time without distortion and peeling of a reflective material, as compared with the optical path changing surface in the form of a half mirror.

In accordance with another aspect of the present invention, there is provided a component-recognizing apparatus comprising a movable head unit having a suction-holding nozzle capable of suction-holding an electronic component and a scanning unit which is installed to the head unit in relatively displaceable with respect to the suction-holding nozzle, the scanning unit being operable to capture an image for image recognition of suction-held conditions of the electronic component being suction-held by the suction-holding nozzle, said scanning unit including: a first optical path changing member which is adapted to be located beneath the suction-holding nozzle and is operable to bend the optical path directed downwardly from the suction-holding nozzle in a lateral direction during the image-sensing operation; a second optical path changing member operable to further bend the bended optical path in another direction so that the bended optical path directs upwardly at a given elevation angle relative to a horizontal plane; and image-sensing means disposed in the optical path changed by the second optical path changing member, the image-sensing means is operable to capture an image of a lower surface of the electronic component being suction-held by the suction-holding nozzle through the first and second optical path changing members.

In this aspect, the image-sensing means is disposed in the optical path which is changed by the second optical path changing member in such a manner as to be directed upwardly at a given elevation angle relative to a horizontal plane. This makes it possible to avoid a situation where the image-sensing means is provided to extend below the second optical path changing member.

Preferably, in the component-recognizing apparatus in accordance with this aspect of the present invention, the first optical path changing member is operable to reflect the optical path striking from beneath the nozzle to the base on approximately horizontally lateral side by about 90 degrees.

According to this feature, each of the first optical path changing member and the second optical path changing member is operable to change the optical path by about 90 degrees, so that an appropriate angular change in optical path and an appropriate width in field of view can be obtained.

Preferably, the first optical path changing member is in the form of a mirror or a prism.

According to this feature, a low-cost optical system can be achieved in terms of the first optical path changing member.

Preferably, the second optical path changing member is in the form of a mirror or a prism.

According to this feature, a low-cost optical system can be achieved in terms of the second optical path changing member.

Preferably, the image-sensing means is in the form of a line sensor, an image sensor of the line sensor are arranged to be inclined with respect to a horizontal direction in such a manner that a direction of the image sensor is set approximately perpendicular to a movement direction along which an image of the electronic component is moved on the image sensor as the scanning unit moves along a row of the suction-holding nozzles.

According to this feature, the image sensor of the line sensor are arranged to be inclined with respect to a horizontal direction in such a manner that a direction of the image sensor is set approximately perpendicular to a movement direction along which an image of the electronic component is moved on the image sensor as the scanning unit moves along the row of the suction-holding nozzles, so that a taken image is formed as a non-distorted image. Therefore, a need for taking time to perform an image processing for a taken image can be eliminated to prevent deterioration in mounting efficiency.

Preferably, the head unit includes a row of the suction-holding nozzles; and the scanning unit is adapted to be moved along the row of suction-holding nozzles to capture an image of suction-held conditions of the electronic component being suction-held by each of the suction-holding nozzles, in a sequential manner.

This feature makes it possible to allow the component-recognizing apparatus to take respective images of the plurality of suction-holding nozzles 6a arranged in a row, and achieve a reduced thickness and a reduced installation space.

In accordance with yet another aspect of the present invention, there is provided a component-recognizing apparatus comprising a row of suction-holding nozzles each capable of suction-holding an electronic component and a scanning unit which is installed to the head unit, the scanning unit is adapted to be relatively displaced with respect to the suction-holding nozzles to perform sequential scanning so as to capture an image for image recognition of suction-held conditions of the electronic component being suction-held by each of the suction-holding nozzles, the scanning unit including: a lower-surface image taking section operable to take an image of a lower surface of the electronic component being suction-held by the suction-holding nozzle when the lower-surface image taking section passes beneath each of the suction-holding nozzles during the scanning operation of the scanning unit; and lower-surface image-sensing means operable to capture an image of the lower surface of the electronic component introduced through the lower-surface image taking section, wherein the scanning unit has a shape configured, in terms of a large-size electronic component having a size exceeding an image-capturing region determined by the lower-surface image taking section and the lower-surface image-sensing means, to be spaced apart from each of the suction-holding nozzles by a given distance, to avoid interference with the large-size electronic component being suction-held by at least one of the suction-holding nozzles, during the scanning operation of the scanning unit.

In this aspect, even in case where the large-size electronic component requiring image recognition using a fixed camera is attached to at least one of the suction-holding nozzles, the scanning operation for the electronic components attached to the remaining suction-holding nozzles can be performed under a condition that the scanning unit is arranged adjacent to a lower surface of each of the remaining suction-holding nozzles as close as possible, while avoiding interference with the large-size electronic component. Thus, the large-size electronic component can be mixedly transferred together with the electronic components to be subjected to the image-sensing operation using the scanning unit. This makes it possible to allow the component-recognizing apparatus to achieve high flexibility in terms of sequence during transfer of the electronic components, and excellent transfer efficiency.

Preferably, in the component-recognizing apparatus in accordance with this aspect of the present invention, the scanning unit has a recess which allows for taking an image of any electronic component falling within an image-capturing region determined by the lower-surface image taking section and the lower-surface image-sensing means, and allows to have a given distance from each of the suction-holding nozzles to avoid interference with the large-size electronic component, in the given region thereof.

According to this feature, the scanning unit has a recess that maintains a given distance from each of the suction-holding nozzles to avoid interference with the large-size electronic component. This makes it possible to more reliably avoid interference between the scanning unit and the large-size electronic component being suction-held by the suction-holding nozzle.

Preferably, the first optical path changing member is operable to change by about 90 degrees the optical path directed from a lower side of the nozzle toward the base on approximately horizontally lateral side; and the second optical path changing member is operable to change further the optical path from the first optical path changing member, by about 90 degrees.

According to this feature, each of the first optical path changing member and the second optical path changing member is operable to change the optical path by about 90 degrees, so that an appropriate angular change in optical path and an appropriate width in field of view can be obtained.

Preferably, the above component-recognizing apparatus comprises a slit formed between the suction-holding nozzle and the first optical path changing member to restrict a light-passing area.

According to this feature, the slit is formed between the suction-holding nozzle and the first optical path changing member to restrict a light-passing area. This makes it possible to prevent excess light from entering the lower-surface image-sensing means from a region other than the image-capturing region, so as to obtain a clear image free of flare.

Preferably, the above component-recognizing apparatus comprises an optical path changing member operable to bend the light along a lateral side, after the light taken from the lower surface of the electronic component through the lower-surface image taking section, wherein a support member which supports the optical path changing member has an upper surface located below an upper surface of in conformity to an undulating shape of the large-size electronic component.

According to this feature, the upper surface of the support member supporting the optical path changing member is located below the upper surface of the optical path changing member, so that, when each of the suction-holding nozzles passes above the upper surface of the optical path changing member during the scanning operation, no interference with the support member occurs. Thus, a position of each of the suction-holding nozzles during the scanning operation can be set closer to a target position and a component feed section in a vertical direction by just the margin, and therefore a mounting time in the target position and a pickup time in the component feed section can be cut down.

Preferably, the scanning unit includes: side-area image-sensing means disposed lateral to and in side-by-side relation to the lower-surface image-sensing means, to capture an image of an electronic component from a lateral side of the electronic component; and a side-image taking section oriented toward a lateral region of the electronic component, to introduce the image into the side-area image-sensing means, wherein the side-image taking section has a lower end located below an upper surface of the optical path changing member.

According to this feature, the scanning unit is provided with the side-area image-sensing means, so that suction-held conditions can be detected based on a lateral-surface image. In case of adding this function, the lower end of the side-image taking section is located below the upper surface of the optical path changing member, so that the mounting time in the target position and the pickup time in the component feed section are never increased.

A surface-mounting apparatus according to the present invention comprises a movable head unit having a suction-holding nozzle capable of suction-holding an electronic component, the surface-mounting apparatus being adapted to pick up an electronic component from a component feed section by the suction-holding nozzle, and to mount the electronic component onto a board, after taking an image of the electronic component being suction-held by the suction-holding nozzle to perform image recognition of suction-held conditions of the electronic component relative to the suction-holding nozzle. The surface-mounting apparatus is equipped with the above component-recognizing apparatus, as a means to perform the image recognition of the conditions of electronic component being suction-held by the suction-holding nozzle.

The surface-mounting apparatus of the present invention is equipped with the above component-recognizing apparatus, as a means to perform the image recognition of the conditions of electronic component being suction-held by the suction-holding nozzle. Thus, an opposed distance between the head unit and a base can be reduced to downsize the surface-mounting apparatus in its entirety and facilitate a reduction in installation space of the surface-mounting apparatus. Further, in case where the scanning unit has a shape configured to be spaced apart from each of the suction-holding nozzles by a given distance, the surface-mounting apparatus can transfer the small-size electronic components and the large-size electronic component being suction-held by the respective suction-holding nozzles, while avoiding interference between the scanning unit and the large-size electronic component, so as to achieve high flexibility in terms of transfer sequence, and excellent transfer efficiency.

A component-inspecting apparatus according to the present invention comprises a movable head unit having a suction-holding nozzle capable of suction-holding an electronic component, the component-inspecting apparatus being adapted to pick up an electronic component from a component feed section by the suction-holding nozzle, and to transfer the electronic component to inspection means to carry out various inspections, after taking an image of the electronic component being suction-held by the suction-holding nozzle to perform image recognition of suction-held conditions of the electronic component relative to the suction-holding nozzle. The component-inspecting apparatus is equipped with the component-recognizing apparatus as defined in any one of claims 1 to 18, as a means to perform the image recognition of the conditions of electronic component being suction-held by the suction-holding nozzle.

The component-inspecting apparatus of the present invention is equipped with the above component-recognizing apparatus, as a means to perform the image recognition of the conditions of electronic component being suction-held by the suction-holding nozzle. Thus, an opposed distance between the head unit and a base can be reduced to downsize the component-inspecting apparatus in its entirety and facilitate a reduction in installation space of the component-inspecting apparatus. Further, in case where the scanning unit has a shape configured to be spaced apart from each of the suction-holding nozzles by a given distance, the component-inspecting apparatus can transfer the small-size electronic components and the large-size electronic component being suction-held by the respective suction-holding nozzles, while avoiding interference between the scanning unit and the large-size electronic component, so as to achieve high flexibility in terms of transfer sequence, and excellent transfer efficiency.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. A component-recognizing apparatus comprising a scanning unit which is installed to a movable head unit having a plurality of suction-holding nozzles in a raw, each of the plurality of suction-holding nozzles being capable of suction-holding an electronic component, the scanning unit being adapted to be displaceable in a direction relative to the plurality of suction-holding nozzles, the scanning unit being operable to capture an image for image recognition of suction-held conditions of the electronic component being suction-held by each of the plurality of suction-holding nozzles, said scanning unit including:

a first optical path changing member which is adapted to be located beneath the plurality of suction-holding nozzles and is operable to reflect the optical path directed downwardly from the plurality of suction-holding nozzles in a lateral direction during the image-sensing operation;

a second optical path changing member operable to further reflect the reflected optical path in another direction so that the reflected optical path directs upwardly at a given elevation angle inclined relative to both horizontal and vertical planes; and image-sensing means including an image sensor in the form of a line sensor provided in the image-sensing means, the image sensor being operable to capture an image of a lower surface of the electronic component being suction-held by each of the plurality of suction-holding nozzles through the first and second optical path changing members, the scanning unit being adapted to be moved along the row of suction-holding nozzles beneath the nozzle unit to capture an image of suction-held conditions of the electronic component being suction-held by each of the suction-holding nozzles, in a sequential manner, and the image-sensing means being disposed along the optical path changed by the second optical path changing member, such that the image-sensing means are inclined relative to both horizontal and vertical planes, the image sensor being arranged inside of the image-sensing means to be inclined with respect to a horizontal direction in such a manner that a direction of the image sensor is set approximately perpendicular to a movement direction along which an image of the electronic component is moved on the image sensor as the scanning unit moves along a row of the suction-holding nozzles.

2. The component-recognizing apparatus as defined in claim 1, wherein the first optical path changing member is operable to reflect the optical path striking from beneath the nozzle to the base on approximately horizontally lateral side by about 90 degrees.

3. The component-recognizing apparatus as defined in claim 1, wherein the first optical path changing member is in the form of a mirror.

4. The component-recognizing apparatus as defined in claim 1, wherein the first optical path changing member is in the form of a prism.

5. The component-recognizing apparatus as defined in claim 1, wherein the second optical path changing member is in the form of a mirror.

6. The component-recognizing apparatus as defined in claim 1, wherein the second optical path changing member is in the form of a prism.

7. The component-recognizing apparatus as defined in claim 1, comprising a slit formed between the plurality of suction-holding nozzles and the first optical path changing member to restrict a light-passing area.

8. A surface-mounting apparatus comprising a movable head unit having a plurality of suction-holding nozzles in a raw, each of the plurality of suction-holding nozzles being capable of suction-holding an electronic component, the surface-mounting apparatus being adapted to pick up an electronic component from a component feed section by each of the plurality of suction-holding nozzles, and to mount the electronic component onto a board, after taking an image of the electronic component being suction-held by each of the plurality of suction-holding nozzles to perform image recognition of suction-held conditions of the electronic component relative to the respective suction-holding nozzles, wherein the surface-mounting apparatus is equipped with the component-recognizing apparatus as defined in claim 1 as a means to perform the image recognition of the conditions of electronic component being suction-held by each of the plurality of suction-holding nozzles.

9. A component-inspecting apparatus comprising a movable head unit having a plurality of suction-holding nozzles in a raw, each of the plurality of suction-holding nozzles being capable of suction-holding an electronic component, the component-inspecting apparatus being adapted to pick up an electronic component from a component feed section by each of the plurality of suction-holding nozzles, and to transfer the electronic component to inspection means to carry out various inspections, after taking an image of the electronic component being suction-held by each of the plurality of suction-holding nozzles to perform image recognition of suction-held conditions of the electronic component relative to the respective suction-holding nozzles, wherein the component-inspecting apparatus is equipped with the component-recognizing apparatus as defined in claim 1, as a means to perform the image recognition of the conditions of electronic component being suction-held by each of the plurality of suction-holding nozzles.

* * * * *